United States Patent
Taylor et al.

(10) Patent No.: US 11,647,673 B2
(45) Date of Patent: May 9, 2023

(54) HIGH-TEMPERATURE SUPERCONDUCTING SEEBECK NANO-SCALE THZ ANTENNA

(71) Applicant: The United States of America as represented by the Secretary of the Navy, San Diego, CA (US)

(72) Inventors: Benjamin J. Taylor, Escondido, CA (US); Teresa H. Emery, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 189 days.

(21) Appl. No.: 17/355,005

(22) Filed: Jun. 22, 2021

(65) Prior Publication Data

US 2022/0407221 A1 Dec. 22, 2022

(51) Int. Cl.
  *H10N 10/17* (2023.01)
  *H10N 60/20* (2023.01)

(52) U.S. Cl.
  CPC ............ *H10N 10/17* (2023.02); *H10N 10/81* (2023.02); *H10N 60/0941* (2023.02); *H10N 60/124* (2023.02); *H10N 60/20* (2023.02); *H10N 60/203* (2023.02)

(58) Field of Classification Search
  None
  See application file for complete search history.

(56) References Cited

U.S. PATENT DOCUMENTS

| | | | | |
|---|---|---|---|---|
| 5,171,733 A | * | 12/1992 | Hu | G01J 5/20 374/176 |
| 5,215,959 A | * | 6/1993 | Van Duzer | H01Q 1/364 343/700 R |
| 6,914,576 B1 | * | 7/2005 | Sahba | H01Q 9/16 343/793 |

(Continued)

FOREIGN PATENT DOCUMENTS

WO  WO-2015135513 A1 * 9/2015 ............ G01R 33/389

OTHER PUBLICATIONS

Saijo et al., "Terahertz emission properties from YBCO thin film log-periodic antennas", Physica C 362 (2001), pp. 319-323. (Year: 2001).*

(Continued)

*Primary Examiner* — Scott B Geyer
(74) *Attorney, Agent, or Firm* — Naval Information Warfare Center Pacific; Kyle Eppele; J. Eric Anderson

(57) ABSTRACT

An antenna comprising; a substrate; a continuous film of yttrium barium copper oxide (YBCO) disposed on the substrate having first and second regions, wherein the first region has a first oxygen doping level and wherein the second region has a second oxygen doping level that is different from the first oxygen doping level; a nano-scale conductive structure, shaped to resonate at a terahertz (THz) frequency, disposed on a boundary between the first and second regions; and a conductive path electrically connected to the first and second regions and to the conductive structure such that induced current in the structure due to incom- (Continued)

ing THz radiation heats the boundary thereby creating a thermal gradient, which results in the generation of Seebeck effect voltage.

20 Claims, 7 Drawing Sheets

(56) References Cited

U.S. PATENT DOCUMENTS

| | | | | |
|---|---|---|---|---|
| 7,078,695 | B2 * | 7/2006 | Luukanen | G01J 5/20 |
| | | | | 250/336.2 |
| 7,192,661 | B1 * | 3/2007 | Tauber | H10N 60/0632 |
| | | | | 257/E39.015 |
| 2020/0259067 | A1 * | 8/2020 | Walker | H03B 15/003 |

OTHER PUBLICATIONS

Saijo et al., "Terahertz radiation from YBCO thin film log-periodic antennas", Journal of Superconductivity: Incorporating Novel Magnetism, vol. 16, No. 5, Oct. 2003, 5 pages. (Year: 2003).*

Tonouchi et al., "Enhanced THz radiation from YBCO thin film bow-tie antennas with hyper-hemispherical MgO lens", IEEE Transaction on Applied Superconductivity, vol. 7, No. 2, Jun. 1997, 4 pages. (Year: 1997).*

Shimakage et al., "Noise temperature measurement of YBCO Josephson mixers in millimeter and submillimeter waves", IEEE Transaction on Applied Superconductivity, vol. 7, No. 2, Jun. 1997, 4 pages. (Year: 1997).*

Tominari et al., "Terahertz-pulse radiation properties of oxygen-deficient YBa2Cu3O7-δ thin films", Journal Infrared Milli Terahz Waves, 2013, 34:573-585. (Year: 2013).*

Mubarak et al., "Nano-antenna coupled infrared detector design", Sensors, 18, 3714, 2018, 25 pages. (Year: 2018).*

Tonouchi et al., "Recent topics in High-Tc superconductive electronics", Japanese Journal of Applied Physics, 2005, vol. 44, No. 11, pp. 7735-7749. (Year: 2005).*

Y. C. Xu et al.; Terahertz Spectrometer Based on High Temperature Superconducting Josephson Junction; IEEE, 41st International Conference on Infrared, Millimeter, and Terahertz waves (IRMMW-THz), 2016.

B. Szentpali et al.; THz Detection by Modified Thermopile; Proc. SPIE 8066, Smart Sensors, Actuators, and MEMS V, 80661R (May 5, 2011).

S. Castilla et al.; Fast and sensitive terahertz detection using an antenna-integrated graphene pn-junction; arXiv:1905.01881v1; May 6, 2019.

J. Du; Harmonic Mixing Using a HTS Step-Edge Josephson Junction at 0.6 THz; IEEE Transactions on Applied Superconductivity; Jun. 2017.

E. Holdengreber et al.; THz Radiation Measurement with HTSC Josephson Junction Detector Matched to Planar Antenna; Applied Sciences; Sep. 17, 2020.

X. Gao et al.; Design, Modelling and Simulation of a Monolithic High-Tc Superconducting Terahertz Mixer Superconducting Science and Technology, 31; 2018.

D.Y. An et al.; Terahertz emission and detection both based on high-Tc superconductors: Towards an integrated receiver; Appl. Phys. Lett. 102, 092601 (2013).

* cited by examiner

US 11,647,673 B2

HIGH-TEMPERATURE SUPERCONDUCTING SEEBECK NANO-SCALE THZ ANTENNA

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 108665.

BACKGROUND OF THE INVENTION

The invention disclosed and claimed herein relates to terahertz (THz) antennas. The Earth's atmosphere readily absorbs most THz wavelengths. Seebeck nanoantennas are devices that are simple nanometer-sized thermocouples (also referred to as thermopiles) which act as nanoantennas and generate DC power by the Seebeck effect when they operate at resonance. The well-known Seebeck effect entails the generation of a thermoelectric voltage when a temperature difference is established between two ends of a conductor. A thermocouple is made when two different conductors join together at one end (typically the hot end). If there is a temperature difference ($\Delta T$), then a thermoelectric voltage ($\Delta V$) is obtained at the open (cold) end. Existing THz thermopile antennas are made from metallic or semiconducting materials. There is a need for an improved THz antenna.

SUMMARY

Disclosed herein is an antenna comprising a substrate, a continuous film of a superconductor, such as yttrium barium copper oxide $YBa_2Cu_3O_x$ (YBCO), a nano-scale conductive structure, and a conductive path. The continuous film of YBCO is disposed on the substrate and has first and second regions. The first region has a first oxygen doping level. The second region has a second oxygen doping level that is different from the first oxygen doping level. The nano-scale conductive structure, which is shaped to resonate at a terahertz (THz) frequency, is disposed on a boundary between the first and second regions. The conductive path is electrically connected to the first and second regions and to the conductive structure such that induced current in the structure due to incoming THz radiation heats the boundary thereby creating a thermal gradient, which results in the generation of Seebeck effect voltage.

Also disclosed herein is a method for providing an antenna that comprises the following steps. The first step provides for disposing a continuous film of YBCO on a substrate thereby creating a first region having a first oxygen doping level and a second region having a second oxygen doping level that is different from the first oxygen doping level. Another step provides for patterning a nano-scale conductive structure, shaped to resonate at a THz frequency, on a boundary between the first and second regions. Another step provides for patterning a conductive path on the continuous YBCO film such that the first and second regions are electrically connected such that induced current in the structure due to incoming THz radiation heats the boundary thereby creating a thermal gradient, which results in the generation of Seebeck effect voltage.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed antenna and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other antenna and methods described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise.

Figure 1:
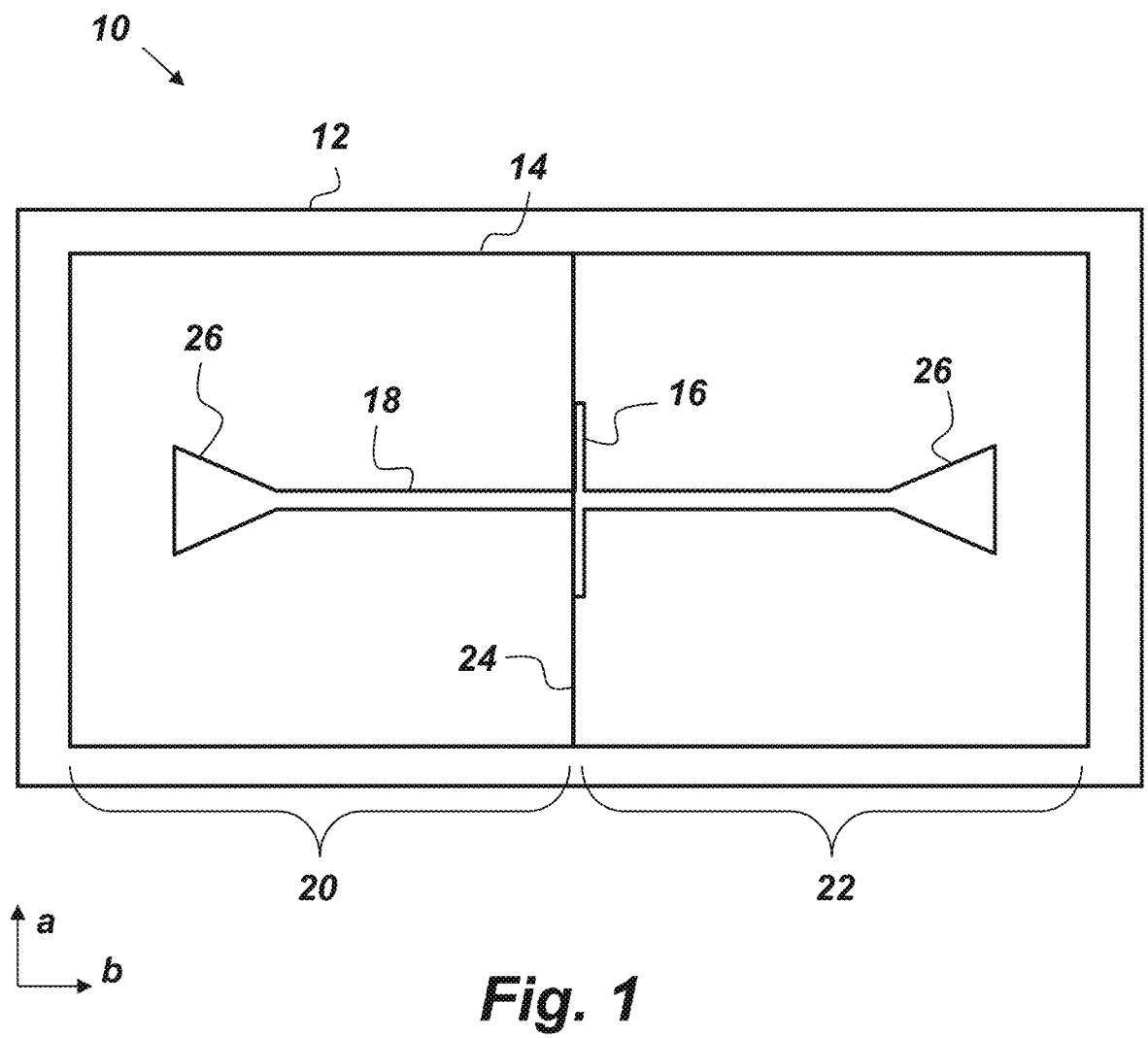
FIG. 1 is a top-view illustration of an embodiment of a high-temperature superconducting Seebeck nano-scale THz antenna.

FIG. 1 is a top-view illustration of an embodiment of a high-temperature superconducting Seebeck nano-scale THz antenna 10 (hereinafter referred to as the antenna 10). The antenna 10 comprises, consists of, or consists essentially of a substrate 12, a continuous film 14 of a high temperature superconductor, a nano-scale conductive structure 16, and a conductive path 18. The continuous film 14 is disposed on the substrate 12 and comprises first and second regions 20 and 22 respectively. The first region 20 has a first oxygen doping level. The second region has a second oxygen doping level that is different from the first oxygen doping level. For example, the first region 20 may be $YBCO_{6.8}$ and the second region 22 may be $YBCO_7$. The nano-scale conductive structure 16, which is shaped to resonate at a THz frequency, is disposed on a boundary 24 between the first and second regions 20 and 22. The conductive path 18 is electrically connected to the first and second regions 20 and 22 and to the conductive structure 16 such that induced current in the structure 16 due to incoming THz radiation heats the boundary 24 thereby creating a thermal gradient, which results in the generation of Seebeck effect voltage. The Seebeck effect will be enhanced by the large internal electric field that forms across the continuous film oxygen boundary 24 due to the difference in charge carriers on each side.

The continuous film 14 may be made of any high-temperature superconductor. Suitable examples of the continuous film 14 include, but are not limited to YBCO and the general class of superconductors which share the same perovskite crystal structure as YBCO. Another suitable example of the continuous film 14 is a compound belonging to the class of compounds having a compositional form of $R_{1-y}M_yBa_2Cu_{3-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn). In some cases it may be advantageous to also substitute in part Fluorine for Oxygen.

Suitable examples of the substrate 12 include, but are not limited to aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ), or any combination thereof or of similar materials. The conductive structure 16 may be any structure that resonates at a THz frequency.

In the embodiment of the antenna 10 shown in FIG. 1, the conductive structure 16 is a single-frequency, nano-scale, largely-two-dimensional, THz-resonant dipole structure. The induced electrical current in the conductive structure 16 will heat the junction region (i.e., boundary 24) creating a thermal gradient which results in Seebeck effect voltage that can be sensed at terminals of the antenna 10. Example terminals 26 are shown in FIG. 1.

Antenna 10 is a superconducting device capable of detecting (far infrared) THz radiation ($\sim 0.1$ THz$<v<10$ THz). Depending upon the application, the configuration and layout of the antenna 10 may vary and some embodiments of the antenna 10 are anticipated to exhibit various properties including near to single photon sensitivity, sub-micron scale positional accuracy, and high-speed thermal recovery. The THz radiation band is typically defined as the spectral region within frequency range $v \sim 0.1$-10 THz, and may be used in a wide array of applications including material identification, imaging, secured communication, and bio-medical. Embodiments of the antenna 10 are inherently relevant to astrophysical observations due to the fact that close to half of the luminosity of the Universe is contained in the THz band and 98% of all the photons emitted since the formation of the Universe lie in the $v \sim 0.6$-7.5 THz range. Typical peak infrared emissions from objects at temperatures from $-100°$ C. to 200° C. lie in the $v \sim 1$-10 THz range.

In one embodiment of the antenna 10, the continuous film 14 may be made of un-twinned film which, in one embodiment, may be created in an un-twinning process involving subjecting a continuous film of YBCO to a uniaxial pressure and a temperature gradient along a direction of an applied pressure during an oxygen annealing process. An example of an un-twinning process is described in U.S. Pat. Nos. 9,188,514 and 9,450,165, which patents are incorporated by reference herein. The un-twinning process results in a un-twinned film suitable for the continuous film 14 and the formation of the abrupt boundary 24 wherein the two regions (20 and 22) are formed having the two distinct oxygen levels. At this abrupt boundary 24, which may be on the order of a micron or less, there exists a strong internal electrostatic field due to the change in carrier concentration (free electrons). This electric field can reach values on the order of 10 kilo electron volts (keV). Through the heating process initiated by the absorption of the THz photons, this boundary is perturbed and a very large normal-state current is induced, which can be readily measured as a very strong Seebeck effect. However, it is to be understood that the continuous film 14 is not required to be un-twinned. For example, the first and second regions 20 and 22 may be created through a lithography process combined with an electrolysis process, where oxygen is extracted from exposed sections of the continuous film 14 to create the first and second regions 20 and 22 respectively having the first and second oxygen doping levels.

In some scenarios it may be desirable to use a small number of antennas 10 together to give high spatial resolution of thermal imaging. In some embodiments, (see for example, FIG. 6) it may be advantageous to integrate the voltage output of the antenna 10 with superconducting low-noise amplifiers and/or use frequency down-conversion techniques prior to amplification. It may be advantageous to use the output voltage from an embodiment of the antenna 10 to drive an electro-optical device to convert the detected events/signal to a fiber optical fiber and/or circuit.

In contrast to metallic samples that have a high thermal conductivity and heat flows the same in all directions (i.e., metallic materials are thermally isotropic), the compound YBCO has anisotropic thermal conductivity—near x=7, heat flows$\sim 10$ times greater in the in-plane (a-b) direction than in the out of plane direction (in/out of the page with respect to FIG. 1). As the oxygen content decreases in the YBCO (x<7), thermal conductivity is further reduced resulting in regions with differing Seebeck coefficients. Because the heat primarily flows in-plane, heat flow is constrained to be within the film allowing a thermal gradient to be supported across a longer distance before diffusing into the underlying substrate 12 (i.e., thermalizing). These material properties are exploited by the antenna 10.

Figure 2:
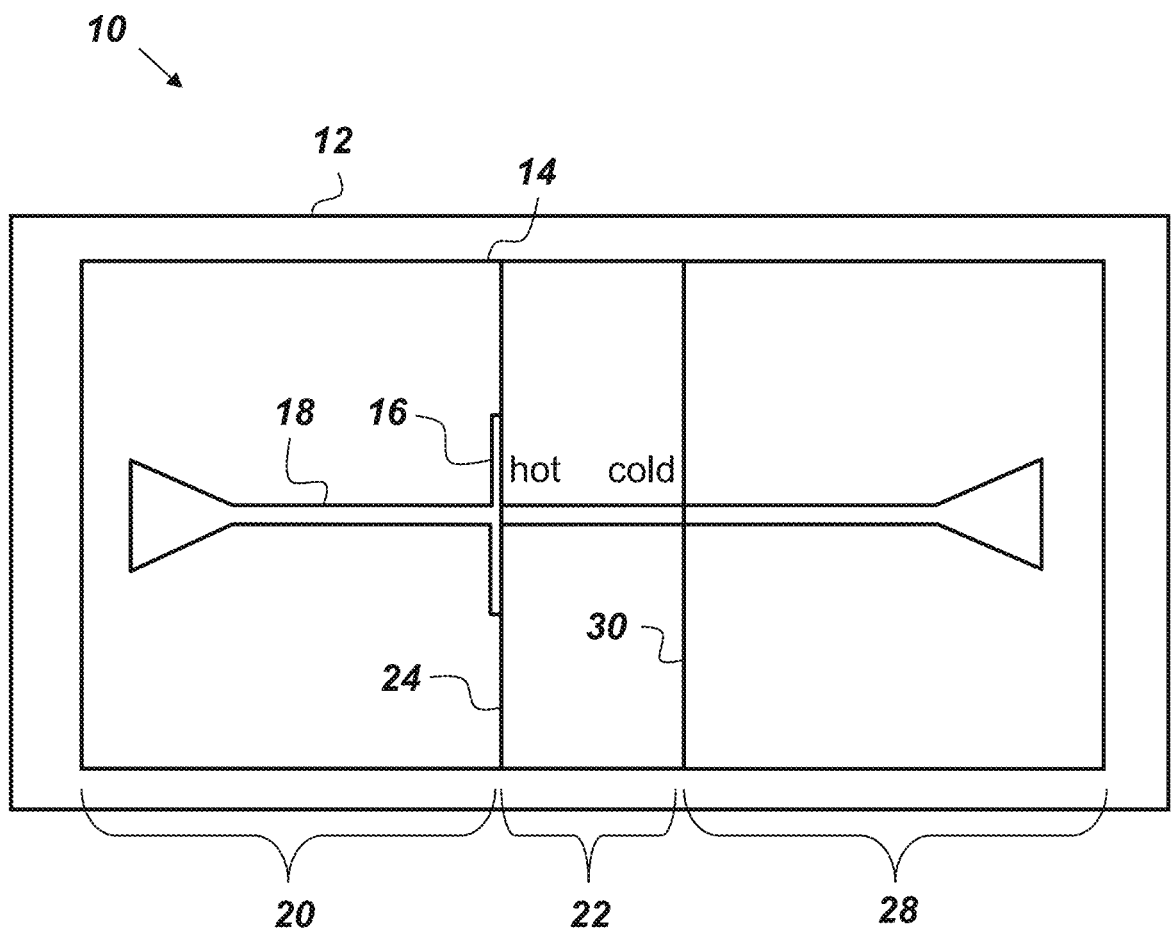
FIG. 2 is a top-view illustration of a three-region embodiment of an antenna.

FIG. 2 is a top-view illustration of a three-region embodiment of the antenna 10. In this embodiment, the continuous film 14 is made of YBCO and further comprises a third region 28 that has an oxygen doping level that is the same as the first region 20's. As shown in FIG. 2, in this embodiment, the second region 22 is disposed between the first and third regions 20 and 28. The three-region embodiment of the antenna 10 has two boundaries: the boundary 24 between the first and second regions 20 and 22, and a second boundary 30 between the second and third regions 22 and 28. In this embodiment, the conductive path 18 electrically connects together the first, second, and third regions 20, 22, and 28.

Figure 3:
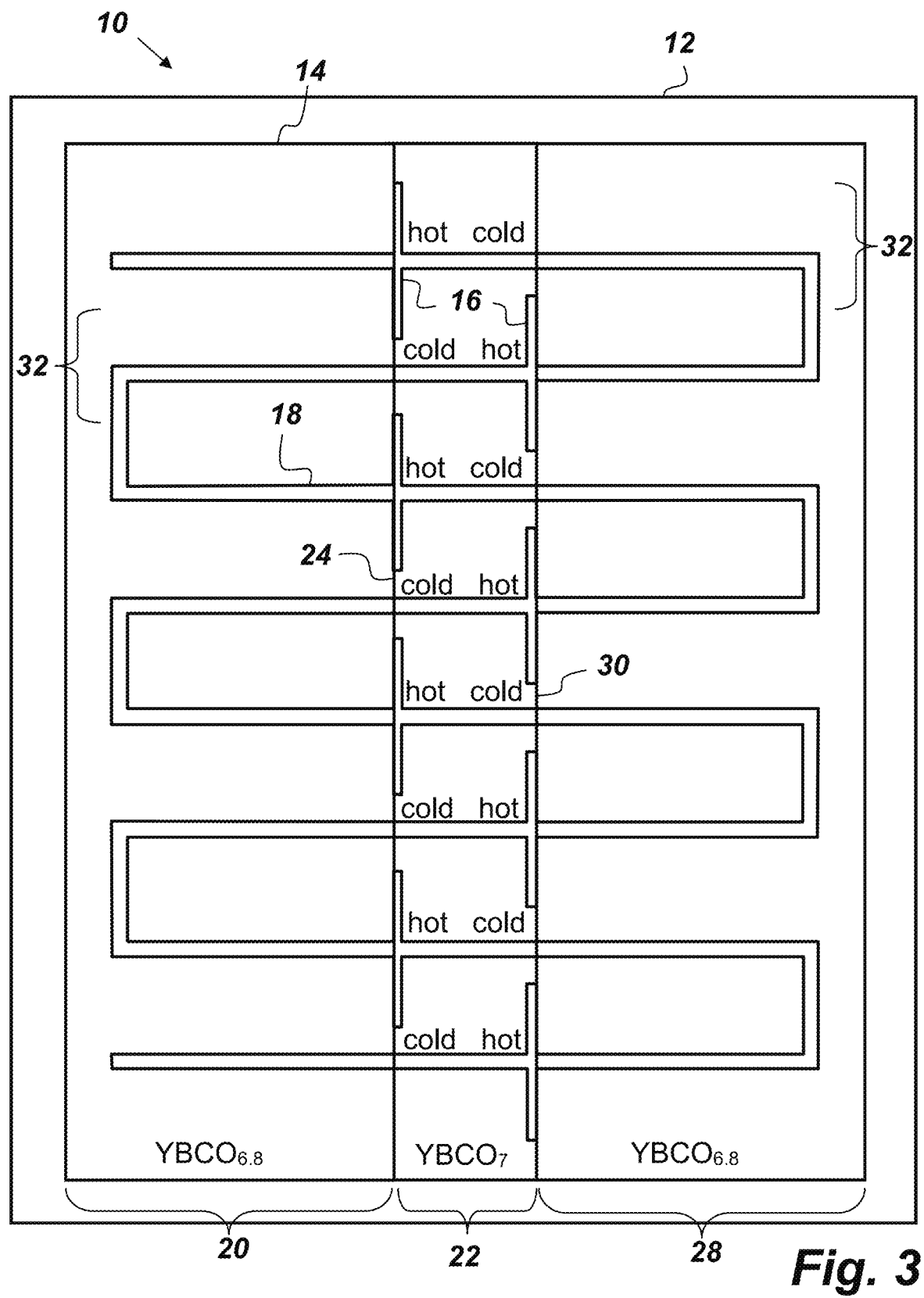
FIG. 3 is a top-view illustration of an embodiment of an antenna.
Figure 4A:
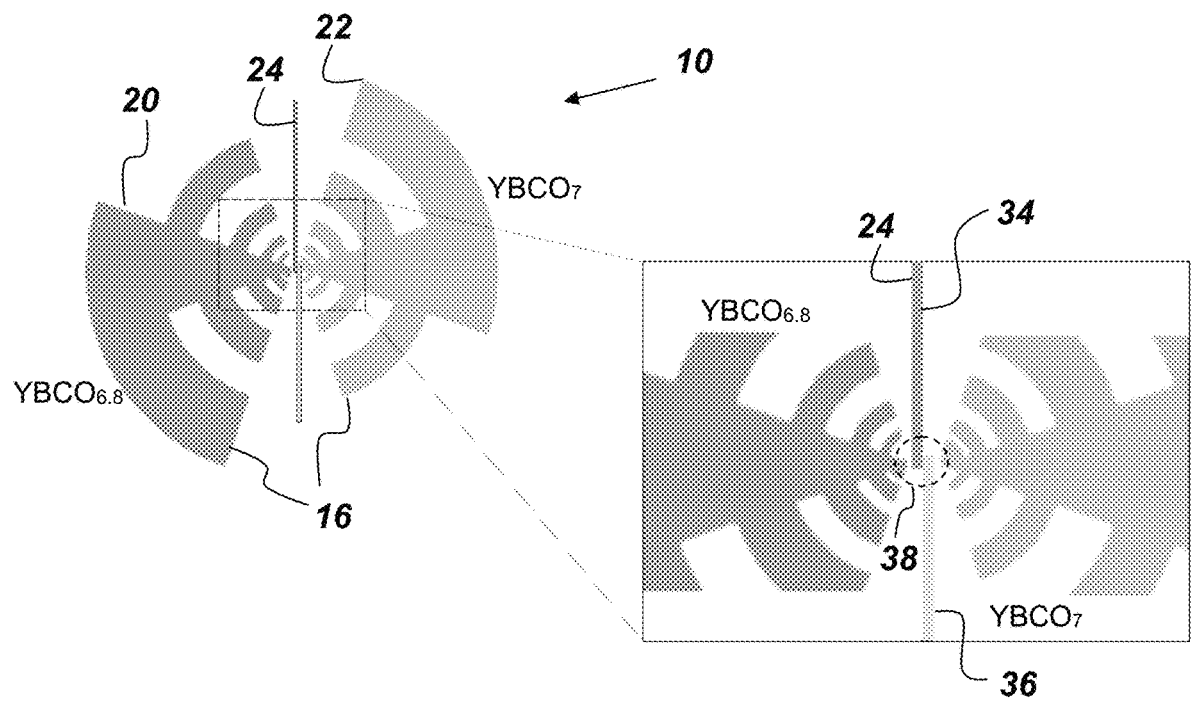
FIGS. 4A and 4B are top-view illustrations of an embodiment of an antenna.
Figure 4B:
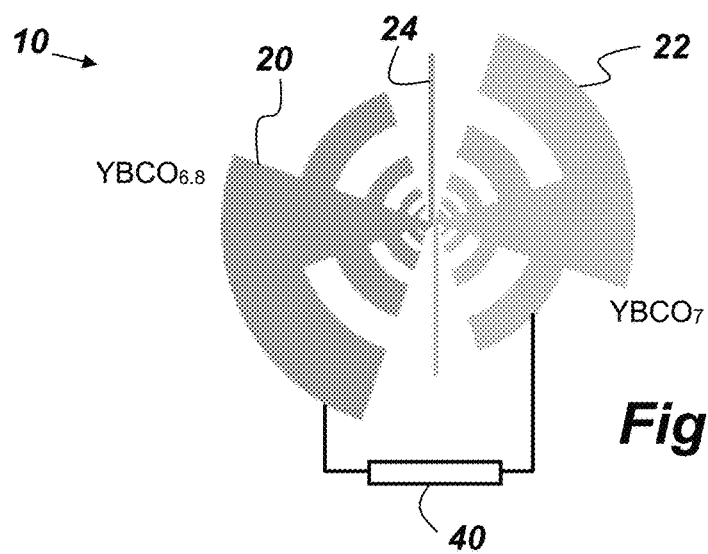

FIG. 3 is a top-view illustration of another embodiment of the antenna 10 that comprises a plurality of nano-scale conductive structures 16 (eight shown in this embodiment)

all connected in series via the conductive path 18 and all disposed on the continuous film 14, which in this embodiment is made of YBCO. In the embodiment of the antenna 10 shown in FIG. 3, the conductive path 18 switches back and forth over the second region 22 and between the first and third regions 20 and 28 with one nanoscale conductive structure 16 per switchback 32 of the conductive path 18. The nanoscale conductive structures 16 are alternatingly disposed on the boundary 24 and the boundary 30. The shape of the conductive path 30 shown in FIG. 3 resembles a square wave, but the shape of the conductive path may be any desired shape. Suitable examples of shapes for the conductive path 18 include, but are not limited to, a zigzag shape, a serpentine shape, a sawtooth shape, and a square wave shape.

FIGS. 4A, 4B, 5A, and 5B are top-view illustrations of embodiments of the antenna 10, where the nanoscale conductive structure 16 is a log-periodic, embedded, circular/saw-tooth antenna structure. In these embodiments, the conductive structure 16 functions as a wideband THz lens that comprises the first and second regions 20 and 22, which are positioned on either side of the boundary 24. The boundary 24 in these embodiments (i.e., the embodiments shown in FIGS. 4A, 4B, 5A, and 5B) is formed by two long line traces 34 and 36 with a small adjoining region 38. The line traces 34 and 36 may be made of superconducting film of differing oxygen content, such as $YBCO_{6.8}$ and $YBCO_7$ respectively. In the embodiment shown in FIG. 4A, the THz antenna structure 16 doesn't touch the boundary 24 and the first and second regions 20 and 22 are floating (i.e., with no connectivity to a common ground). In the embodiment of the antenna 10 shown in FIG. 4B, the THz antenna structure 16 doesn't touch the boundary 24 and the first and second regions 20 and 22 are connected through a load resistor 40 (typically 50 ohms) with no connectivity to a common ground.

Figure 5A:
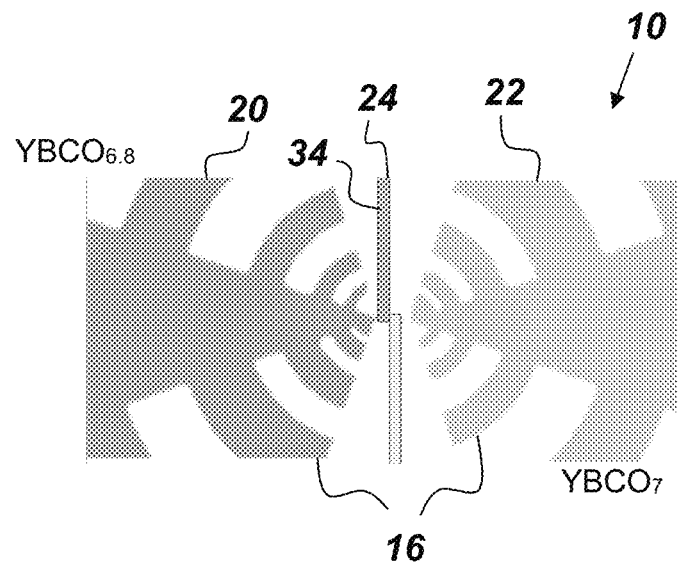
FIGS. 5A and 5B are top-view illustrations of an embodiment of an antenna.
Figure 5B:
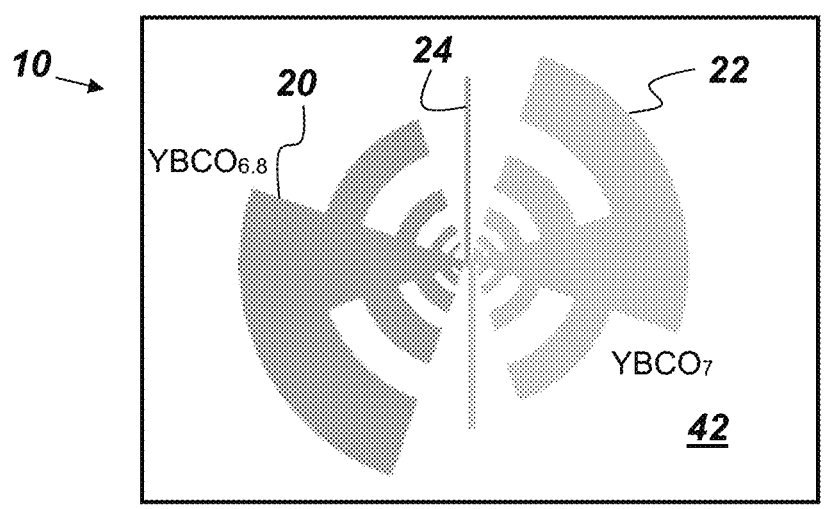

FIGS. 5A and 5B are top-view illustrations of other embodiments of the antenna 10, where the nanoscale conductive structure 16 is a log-periodic, embedded, circular/saw-tooth antenna structure. In the embodiment of the antenna 10 shown in the close-up, partial-view in FIG. 5A, one side (i.e., region 20) of the THz antenna structure 16 is in electrical and physical contact with trace line 34 of the boundary region 24 and both antenna sections (i.e., regions 20 and 22) are floating with no connectivity to a common ground. In the embodiment shown in FIG. 5B, region 20 of the THz antenna structure 16 is not grounded and touches the boundary region 24, and region 22 is connected to a common ground 42. In all the above-described embodiments of the THz log-periodic antenna 10 shown in FIGS. 4A, 4B, 5A, and 5B, the first and second regions 20 and 22 may be made of any superconducting material having differing Seebeck coefficients. For example, the antenna structure 16 may be fabricated from the YBCO film where one side (i.e., region 20) is made of $YBCO_{6.8}$ and the other side of the antenna structure 16 (i.e., region 22) is made of $YBCO_7$. Voltage terminals may be connected to the long lines 34 and 36 so that the voltage is measured across the boundary 24 as it is affected by focused THz signal(s).

Figure 6A:
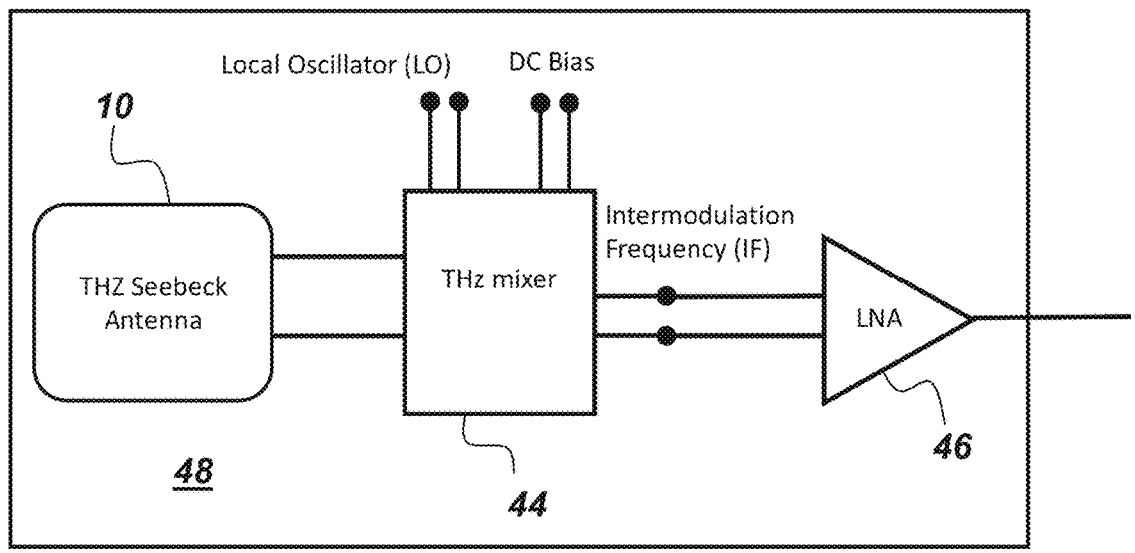
FIGS. 6A and 6B are schematic diagrams of an embodiment of an antenna.
Figure 6B:
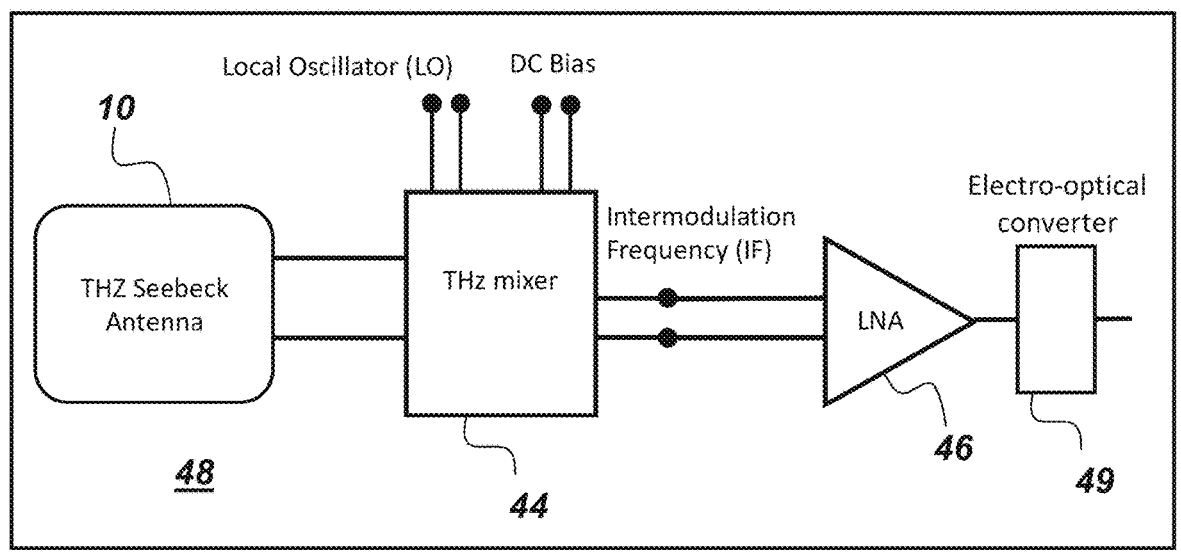

FIG. 6A is a schematic diagram showing an embodiment of the antenna 10 that is integrated with an on-chip frequency down-converter 44 and an on-chip superconducting low-noise amplifier 46. In this embodiment, the antenna 10, the frequency down-converter 44, and the low-noise amplifier 46 are all located on the same superconducting chip 48. The frequency down-converter 44 is configured to convert the Seebeck effect voltage into a converted voltage and the superconducting low-noise amplifier 46 is configured to amplify the converted voltage. A suitable example of the frequency down-converter 44 is, but is not limited to, a Josephson junction-based frequency down converter. FIG. 6B is a schematic diagram showing an embodiment of the antenna 10 connected to an electro-optical converter 49 in addition to the components shown in FIG. 6A. The electro-optical converter 49 is configured to convert the amplified converted voltage into an optical signal. A number of variations could be included in the antenna 10. For example, electrically resonant 2D structures may be used to couple radiation to the thermocouple junctions (i.e., the boundary 24 and/or the boundary 30). High directionality and polarization sensing can be enabled by such structures.

Figure 7:
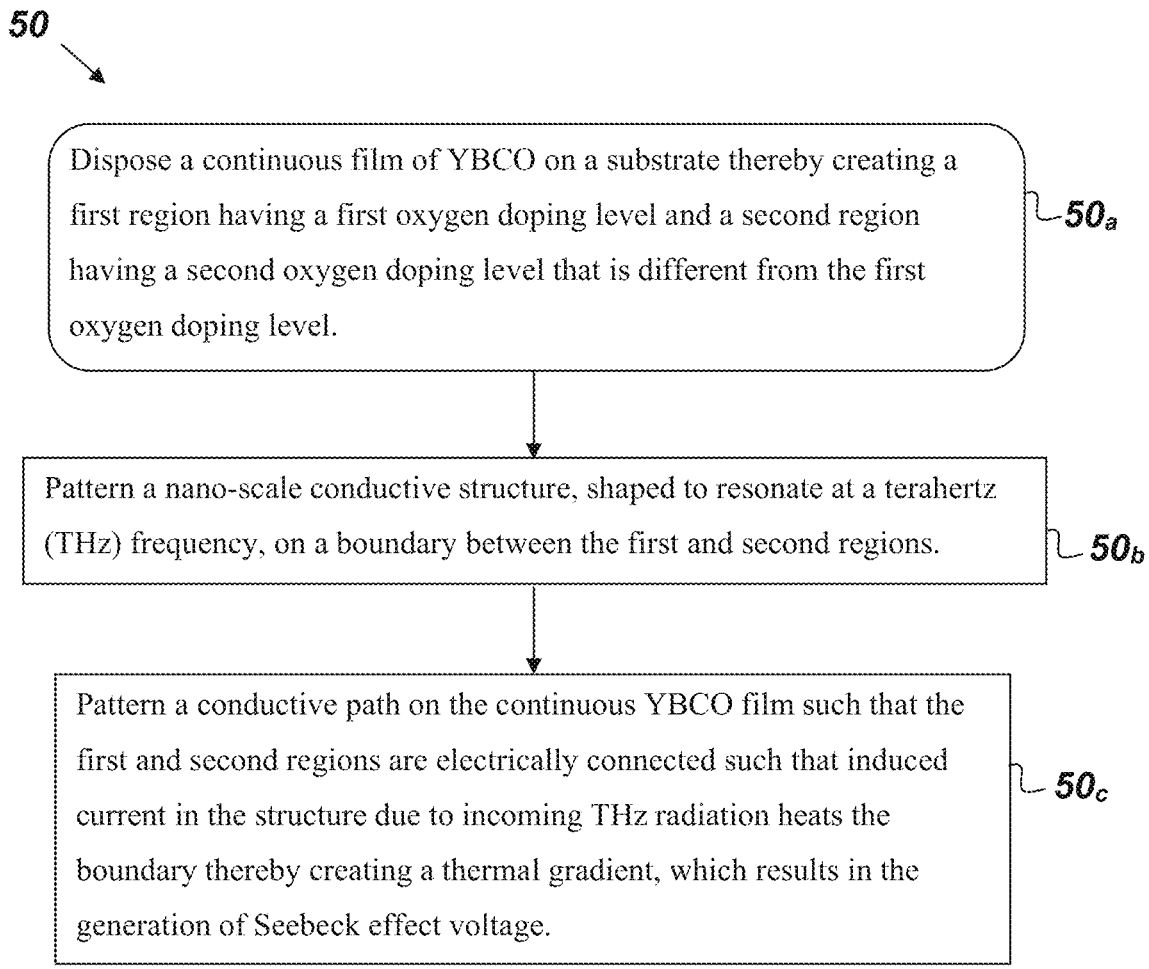
FIG. 7 is a flowchart of a method.

FIG. 7 is a flowchart of a method 50 for providing the antenna 10. Method 50 comprises the following steps. The first step $50_a$ provides for disposing a continuous film of YBCO on a substrate thereby creating a first region having a first oxygen doping level and a second region having a second oxygen doping level that is different from the first oxygen doping level. Another step $50_b$ provides for patterning a nano-scale conductive structure, shaped to resonate at a terahertz (THz) frequency, on a boundary between the first and second regions. Another step $50_c$ provides for patterning a conductive path on the continuous YBCO film such that the first and second regions are electrically connected such that induced current in the structure due to incoming THz radiation heats the boundary thereby creating a thermal gradient, which results in the generation of Seebeck effect voltage. The step $50_a$ of creating the first and second regions may comprise using an un-twinning process that includes subjecting the continuous film of YBCO to a uniaxial pressure and a temperature gradient along a direction of an applied pressure during an oxygen annealing process such that the resulting continuous film is twinned. Alternatively, the step $50_a$ may comprise using a lithography process combined with an electrolysis process, including extracting oxygen from exposed sections of the continuous YBCO film to create the first and second regions having the first and second oxygen doping levels respectively.

From the above description of the antenna 10, it is manifest that various techniques may be used for implementing the concepts of antenna 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that antenna 10 is not limited to the particular embodiments described herein, but is capable of many embodiments without departing from the scope of the claims.

We claim:
1. An antenna comprising:
  a substrate;
  a continuous film of yttrium barium copper oxide (YBCO) disposed on the substrate having first and second regions, wherein the first region has a first oxygen doping level and wherein the second region has a second oxygen doping level that is different from the first oxygen doping level;
  a nano-scale conductive structure, shaped to resonate at a terahertz (THz) frequency, disposed on a boundary between the first and second regions; and
  a conductive path electrically connected to the first and second regions and to the conductive structure such that induced current in the structure due to incoming THz radiation heats the boundary thereby creating a thermal gradient, which results in the generation of Seebeck effect voltage.

2. The antenna of claim 1, wherein the first and second regions and the boundary are created in an un-twinning process involving subjecting the continuous film of YBCO to a uniaxial pressure and a temperature gradient along a direction of an applied pressure during an oxygen annealing process such that the continuous film is an un-twinned film.

3. The antenna of claim 2, wherein the boundary has a thickness of less than or equal to a micron, and wherein a strong internal electrostatic field (i.e., >1 kilo electron volts) due to a change in carrier concentration exists at the boundary as a result of the un-twinning process.

4. The antenna of claim 3, further comprising a plurality of nano-scale conductive structures and conductive paths as claimed in claim 1, wherein the plurality of nano-scale conductive structures and conductive paths are all disposed on the continuous YBCO film.

5. The antenna of claim 2, wherein the first region is made of $YBCO_{6.8}$ and the second region is made of $YBCO_7$.

6. The antenna of claim 1, wherein the first and second regions are created through a lithography process combined with an electrolysis process, wherein oxygen is extracted from exposed sections of the continuous YBCO film to create the first and second regions respectively having the first and second oxygen doping levels.

7. The antenna of claim 1, wherein the nano-scale conductive structure is an electrically resonant, largely-two-dimensional (2D) structure positioned so as to couple the incoming THz radiation to the boundary.

8. The antenna of claim 1, wherein the continuous YBCO film further comprises a third region having an oxygen doping level that is the same as the first oxygen doping level, wherein the second region is disposed between the first and third regions.

9. The antenna of claim 8, wherein the conductive path electrically connects together the first, second, and third regions.

10. The antenna of claim 9, wherein the conductive path switches back and forth over the second region and between the first and third regions.

11. The antenna of claim 10, further comprising a plurality of nanoscale conductive structures disposed in series along the conductive path with one nanoscale conductive structure per switchback of the conductive path, wherein the nanoscale conductive structures are alternatingly disposed on the boundary between the first and second regions and a boundary between the second and third regions.

12. The antenna of claim 10, wherein a shape of the conductive path is selected from a group consisting of: a zigzag shape, a serpentine shape, a sawtooth shape, and a square wave shape.

13. The antenna of claim 1, wherein the nanoscale conductive structure is a log-periodic embedded structure.

14. The antenna of claim 1, further comprising a superconducting low-noise amplifier configured so as to receive the Seebeck effect voltage.

15. The antenna of claim 1, further comprising a frequency down-converter and a superconducting low-noise amplifier, wherein the frequency down-converter is configured to convert the Seebeck effect voltage into a converted voltage and the superconducting low-noise amplifier is configured to amplify the converted voltage.

16. The antenna of claim 15, further comprising an electro-optical converter configured to convert the amplified converted voltage into an optical signal.

17. The antenna of claim 15, wherein the substrate, the continuous film, the nano-scale conductive structure, the conductive path, the frequency down-converter, and the low noise amplifier are all disposed on a superconducting chip.

18. A method for providing an antenna comprising:
disposing a continuous film of yttrium barium copper oxide (YBCO) on a substrate thereby creating a first region having a first oxygen doping level and a second region having a second oxygen doping level that is different from the first oxygen doping level;
patterning a nano-scale conductive structure, shaped to resonate at a terahertz (THz) frequency, on a boundary between the first and second regions; and
patterning a conductive path on the continuous YBCO film such that the first and second regions are electrically connected such that induced current in the structure due to incoming THz radiation heats the boundary thereby creating a thermal gradient, which results in the generation of Seebeck effect voltage.

19. The method of claim 18, wherein the step of creating the first and second regions further comprises using an un-twinning process that includes subjecting the continuous film of YBCO to a uniaxial pressure and a temperature gradient along a direction of an applied pressure during an oxygen annealing process such that the resulting continuous film is un-twinned.

20. The method of claim 18, wherein the step of creating the first and second regions further comprises using a lithography process combined with an electrolysis process, including extracting oxygen from exposed sections of the continuous YBCO film to create the first and second regions having the first and second oxygen doping levels respectively.

* * * * *